United States Patent
Ryu et al.

(10) Patent No.: US 8,027,017 B2
(45) Date of Patent: Sep. 27, 2011

(54) SUBSTRATE TREATING APPARATUS AND EXPOSING APPARATUS FOR CLEANING A CHUCK CLEANING TOOL WITH TREATING BATH

(75) Inventors: Ju-A Ryu, Seoul (KR); Jeong-Heung Kong, Yongin-si (KR); Yang-Koo Lee, Gwacheon-si (KR); Hun-Hwan Ha, Yongin-si (KR); Yo-Han Ahn, Yongin-si (KR); Hweon Jin, Yongin-si (KR); Myung-Ki Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 234 days.

(21) Appl. No.: 12/321,102

(22) Filed: Jan. 15, 2009

(65) Prior Publication Data
US 2009/0180086 A1    Jul. 16, 2009

(30) Foreign Application Priority Data
Jan. 16, 2008   (KR) .................... 10-2008-0004955

(51) Int. Cl.
G03B 27/52 (2006.01)
(52) U.S. Cl. .......................... 355/30; 134/1.3
(58) Field of Classification Search .......... 355/30, 355/53, 72; 396/611; 134/1, 21, 32, 102.3, 134/105, 153, 902, 1.3; 430/325
See application file for complete search history.

(56) References Cited

U.S. PATENT DOCUMENTS

| | | | |
|---|---|---|---|
| 6,565,419 B1 * | 5/2003 | Nishio et al. | 451/28 |
| 2005/0078286 A1 * | 4/2005 | Dierichs et al. | 355/30 |
| 2006/0201540 A1 * | 9/2006 | Hickman et al. | 134/104.1 |
| 2007/0172234 A1 * | 7/2007 | Shigemori et al. | 396/611 |
| 2008/0271747 A1 * | 11/2008 | De Jong et al. | 134/1 |
| 2010/0183987 A1 * | 7/2010 | Yonekawa | 430/325 |

FOREIGN PATENT DOCUMENTS

| | | |
|---|---|---|
| JP | 10-256206 | 9/1998 |
| JP | 2003-77987 | 3/2003 |
| KR | 1999-0039446 | 11/1999 |
| KR | 10-2007-0092342 | 9/2007 |

OTHER PUBLICATIONS

English Translation JP 2003-77987 (dated Mar. 14, 2003).*
English Translation of JP 10-256206 (dated Sep. 25, 1998).*
English Translation of KR 1999-0039446 (dated Nov. 15, 1999).*
English Translation of KR 10-20070092342 (dated Sep. 13, 2007).*

* cited by examiner

*Primary Examiner* — Peter B Kim
*Assistant Examiner* — Chia-how Michael Liu
(74) *Attorney, Agent, or Firm* — Onello & Mello LLP

(57) ABSTRACT

The present inventive concept provides a substrate treating apparatus and an exposing apparatus that a chuck member, a chuck cleaning member including a cleaning tool removing a foreign substance on a substrate loading surface of the chuck member and a tool cleaning member cleaning a cleaning tool are disposed to be adjacent to each other inside a treating room. The present inventive concept also provides a method of cleaning a cleaning tool using a tool cleaning member. According to the above the apparatuses and the method, contamination of a chuck member by a cleaning tool is prevented and a defocus phenomenon caused by a particle on a chuck member during an exposing process can be minimized.

13 Claims, 11 Drawing Sheets

SUBSTRATE TREATING APPARATUS AND EXPOSING APPARATUS FOR CLEANING A CHUCK CLEANING TOOL WITH TREATING BATH

CROSS-REFERENCE TO RELATED APPLICATIONS

This U.S. non-provisional patent application claims priority under 35 U.S.C. §119 of Korean Patent Application No. 10-2008-0004955, filed in the Korean Intellectual Property Office on Jan. 16, 2008, the entire contents of which are hereby incorporated by reference.

BACKGROUND

Exemplary embodiments described herein relate to a substrate treating apparatus and methods of substrate treating, and more particularly, to an apparatus for exposing a substrate and methods of exposing the substrate.

Generally, semiconductor devices are manufactured by repeating a process of sequentially depositing thin films so as to form a predetermined circuit pattern. A plurality of unit processes, such as a deposition process, a photolithography process and an etching process, are performed so as to form and deposit a thin film.

A photolithography process is a process for forming a pattern on a wafer. The photolithography process includes a photoresist coating process, an exposing process and a developing process. The top layer on a wafer is etched using a pattern formed on a wafer by a developing process, so that a device according to a pattern can be formed.

A photoresist coating process is a process of uniformly depositing a photoresist coating which is sensitive to light on a surface of a wafer using a coater. An exposing process is a process of transferring a circuit pattern onto a wafer that includes a photoresist layer by passing a light through a circuit pattern formed on a mask using a stepper. A developing process is a process of developing a portion of the photoresist through which light passes during the exposing process using a developer.

When the processes described above are performed by individually separated apparatuses, a wafer process line is relatively long. As a result, the wafer can be easily contaminated, due to the extended period of time taken to transfer the wafer from one apparatus to another apparatus, during which time the wafer is exposed to the atmosphere. To solve the problem, an in-line type substrate treating apparatus in which a coater, a developer, a baking unit and a stepper are sequentially disposed with an established arrangement has been developed.

An in-line type substrate treating apparatus performing a photolithography process includes a spinner apparatus performing a coating process and a developing process, and a scanner apparatus performing an exposing process which transfers a pattern to a wafer when the coating process is completed. A wafer is transferred between the spinner apparatus and the scanner apparatus by an interface unit disposed between the spinner apparatus and the scanner apparatus.

A wafer stage on which a wafer is placed is provided in the scanner apparatus. When a particle having a size of greater than 0.5 µm is present on a wafer stage, a focus depth of a lens at a position where the particle is present is out of a standard value, which induces a defocus phenomenon. As a result, a resolution of a photoresist layer is degraded due to the defocus phenomenon to cause an abnormal process.

SUMMARY OF THE INVENTIVE CONCEPT

Some exemplary embodiments provide a substrate treating apparatus. The apparatus may include a treating room providing a space where a substrate treating process is performed; a chuck member which is installed on an inside of the treating room and on which a substrate is placed; a chuck cleaning member which is installed to be adjacent to the chuck member and includes a cleaning tool removing a foreign substance on a substrate loading surface of the chuck member; and a tool cleaning member cleaning the cleaning tool.

In one embodiment, the tool cleaning member comprises: a treating bath with an opened top which provides a space in which the cleaning tool is received; a treating solution supply unit supplying a treating solution to the treating bath; and a drain unit including a drain line connected to a drain hole formed on a wall of the treating bath.

In one embodiment, the treating solution supply unit comprises: a chemical solution supply unit including a chemical solution supply line connected to a chemical solution inflowing hole formed on a wall of the treating bath; and a rinse solution supply unit including a rinse solution supply line connected to a rinse solution inflowing hole formed on a wall of the treating bath.

In one embodiment, the apparatus further comprises a chemical solution circulation unit which circulates a chemical solution discharged from the treating bath and resupplies a circulated chemical solution to the treating bath. The chemical solution circulation unit comprises: a circulation line which branches off from the drain line and joins the chemical solution supply line; and a pump installed on the circulation line.

In one embodiment, the tool cleaning member further comprises an ultrasonic vibration unit which is installed on a wall of the treating bath and applies an ultrasonic vibration to a treating solution supplied into the treating bath.

In one embodiment, the tool cleaning member further comprises a drying gas supply unit supplying a drying gas to the cleaning tool received in the treating bath.

In one embodiment, the chuck cleaning member comprises: a first driving member providing a rotatory power to the cleaning tool; a horizontal supporting rod disposed horizontally and having one end, the first driving member being installed at the one end of the horizontal supporting rod; a vertical supporting rod which is connected to the other end of the horizontal supporting rod and disposed to be perpendicular to the horizontal supporting rod; and a second driving member providing a rotatory power to the vertical supporting rod.

In one embodiment, the cleaning tool comprises a cleaning stone.

In one embodiment, the tool cleaning member is disposed to be adjacent to the chuck cleaning member inside the treating room Some exemplary embodiments provide an exposing apparatus. The exposing apparatus may include a treating room providing a space where a substrate treating process is performed; a chuck member which is installed on an inside of the treating room and on which a substrate is placed; an exposing member irradiating light including an image of a circuit pattern onto a substrate placed on the chuck member; a chuck cleaning member which is disposed to be adjacent to the chuck member and includes a cleaning tool removing a foreign substance on a substrate loading surface of the chuck member; and a tool cleaning member cleaning the cleaning tool.

In one embodiment, the tool cleaning member comprises: a treating bath with an opened top providing a space in which the cleaning tool is received; a chemical solution supply unit including a chemical solution supply line connected to a chemical solution inflowing hole formed on a wall of the treating bath; a rinse solution supply unit including a rinse solution supply line connected to a rinse solution inflowing hole formed on a wall of the treating bath; and a drain unit including a drain line connected to a drain hole formed on a wall of the treating bath.

In one embodiment, the apparatus further comprises a chemical solution circulation unit which circulates a chemical solution discharged from the treating bath and resupplies a circulated chemical solution to the treating bath. The chemical circulation unit comprises: a circulation line which branches off from the drain line and joins the chemical solution supply line; and a pump installed on the circulation line.

In one embodiment, the tool cleaning member further comprises an ultrasonic vibration unit which is installed on a wall of the treating bath and applies an ultrasonic vibration to a treating solution supplied into the treating bath.

In one embodiment, the tool cleaning member further comprises a drying gas supply unit supplying a drying gas to the cleaning tool in the treating bath.

In one embodiment, the chuck cleaning member comprises: a first driving member providing a rotatory power to the cleaning tool; a horizontal supporting rod disposed horizontally and having one end, the first driving member being installed at the one end of the horizontal supporting rod; a vertical supporting rod which is connected to the other end of the horizontal supporting rod and disposed to be perpendicular to the horizontal supporting rod; and a second driving member providing a rotatory power to the vertical supporting rod.

In one embodiment, the cleaning tool comprises a cleaning stone.

In one embodiment, the tool cleaning member is disposed to be adjacent to the chuck cleaning member inside the treating room.

Some exemplary embodiments provide a method of cleaning a cleaning tool using an apparatus including a treating room providing a space where a substrate treating process is performed; a chuck member which is installed on an inside of the treating room and on which a substrate is placed; an exposing member irradiating light including an image of a circuit pattern onto a substrate placed on the chuck member; a chuck cleaning member which is installed to be adjacent to the chuck member and includes a cleaning tool removing a foreign substance on a substrate loading surface of the chuck member; and a tool cleaning member cleaning the cleaning tool. The method comprises providing a chemical solution to a treating bath of the tool cleaning member which is provided to a treating room and submerging the cleaning tool which has removed a foreign substance on a substrate loading surface of a chuck member in the treating bath to remove a foreign substance attached on the cleaning tool.

In one embodiment, the method further comprises applying an ultrasonic vibration to the chemical solution in the treating bath.

In one embodiment, the method further comprises discharging the chemical solution from the treating bath, supplying a rinse solution to the treating bath and rinsing the cleaning tool after removing the foreign substance attached on the cleaning tool.

BRIEF DESCRIPTION OF THE FIGURES

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
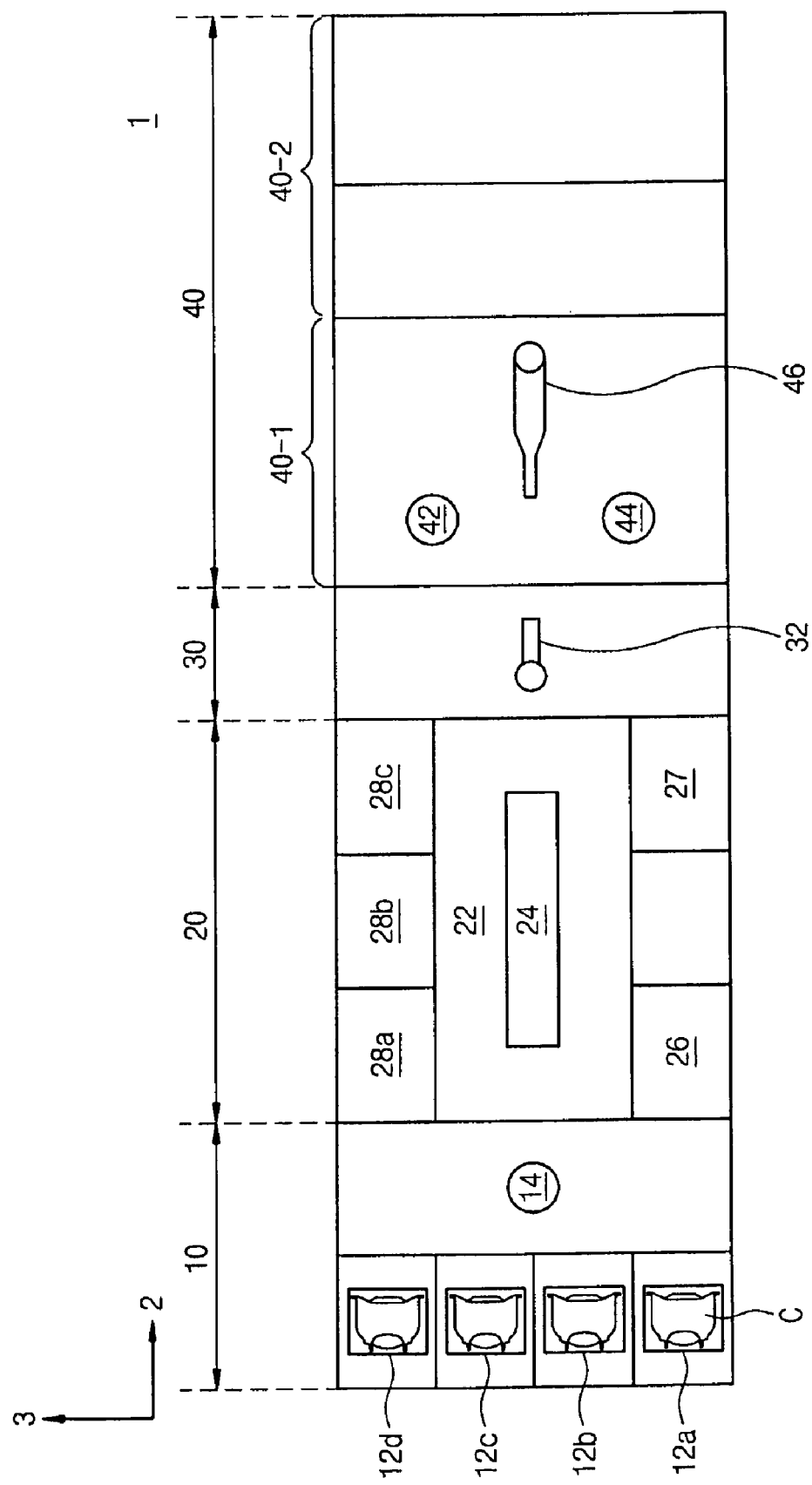
FIG. 1 is a schematic diagram illustrating a substrate treating apparatus including an exposing apparatus according to the present inventive concept.

FIG. 1 is a drawing showing an illustration of a substrate treating apparatus including an exposing apparatus according to the present inventive concept. Referring to FIG. 1, a substrate treating apparatus 1 is an in-line type apparatus in which a photolithography process is sequentially performed. The substrate treating apparatus 1 includes an index 10, a first treating device 20, an interface 30 and a second treating device 40. The index 10, the first treating device 20, the interface 30 and the second treating device 40 are disposed side-by-side in a first direction 2. The index 10 is disposed to be adjacent to a front part of the first treating device 20 along the first direction 2, and the interface 30 is disposed to be adjacent to a rear part of the first treating device 20 along the first direction 2. The index 10 and the interface 30 are disposed to have a lengthwise direction along a second direction 3 which is perpendicular to the first direction 2. The second treating device 40 is disposed to be adjacent to a rear part of the interface 30 along the first direction 2.

The index 10 transfers substrates between containers (C) accommodating substrates and the first treating device 20. The first treating device 20 performs a coating process and a develop process and in one embodiment is a spinner. The interface 30 transfers a substrate on which a photoresist coating is formed between the first treating device 20 and the second treating device 40. The second treating device 40 performs an exposing process and in one embodiment is a scanner. The second treating device 40 in the present embodiment is also referred to herein as an exposing apparatus.

The index 10 transfers substrates from containers (C) to the first treating device 20 and the first treating device 20 performs a photoresist coating process on the substrates. The interface 30 transfers a wafer or substrate on which a photoresist coating is formed from the first treating device 20 to the second treating device 40. The second treating device 40 performs an exposing process on a substrate on which the photoresist coating is formed. The interface 30 transfers a substrate on which an exposing process is performed from the second treating device 40 to the first treating device 20 and the first treating device 20 performs a developing process on the substrate on which an exposing process is performed. The index 10 transfers a substrate on which a developing process is performed from the first treating device 20 to containers (C).

The index 10 is installed to be adjacent to a front part of the first treating device 20. The index 10 includes load ports 12a, 12b, 12c and 12d on which containers (C) receiving substrates are placed and an index robot 14. The load ports 12a, 12b, 12c and 12d are disposed side-by-side along the second direction 3 and the index robot 14 is disposed between the load ports 12a, 12b, 12c and 12d, and the first treating device 20. The container (C) receiving substrates are placed on the load ports 12a, 12b, 12c and 12d by transferring means (not shown) such as an overhead transfer, an overhead conveyor or an automatic guided vehicle. The container (C) may be an airtight container such as a front open unified pod (FOUP). The index robot 14 transfers substrates between the containers (C) placed on the load ports 12a, 12b, 12c and 12d and the first treating device 20.

The first treating device 20 includes a transfer passage 22, a main transfer robot 24 and treating modules 26, 27, 28a, 28b and 28c. The transfer passage 22 is disposed in the first direction 2 from a region adjacent to the index 10 to a region adjacent to the interface 30. The main transfer robot 24 is installed at the transfer passage 22 and the treating modules 26, 27, 28a, 28b and 28c are disposed on both sides of the transfer passage 22 along a lengthwise direction of the transfer passage 22.

The main transfer robot 24 transfers substrates between the index 10, the treating modules 26, 27, 28a, 28b, 28c and the interface 30. The treating modules 26, 27, 28a, 28b and 28c include a coating module 26, a developing module 27 and bake modules 28a, 28b and 28c. The coating module 26 forms a photoresist coating on a surface of a substrate and the developing module 27 develops a pattern formed on a substrate on which an exposing process is performed. Conventionally, the coating module 26 and the developing module 27 adopt a spin method which rotates the substrate at a predetermined velocity so that a photoresist or a developing solution is uniformly spread out on a substrate by a centrifugal force. The bake modules 28a, 28b and 28c heat a substrate at a predetermined temperature before and after a coating process or a developing process. The bake modules 28a, 28b and 28c may include a module performing a soft bake process and a module performing a hard bake process. The first treating device 20 may further include a cooling module which cools a substrate heated at a predetermined temperature.

The interface 30 is disposed between the first treating device 20 and the second treating device 40 and includes an interface robot 32 transferring a substrate. The interface robot 32 transfers a substrate on which a coating process is performed in the first treating device 20 to the second treating device 40. The interface robot 32 transfers a substrate on which an exposing process is performed in the second treating device 40 to the first treating device 20.

The second treating device 40 includes a substrate transferring module 40-1 and an exposing module 40-2. The substrate transferring module 40-1 and the exposing module 40-2 are disposed side-by-side along the first direction 2. The substrate transferring module 40-1 is disposed to be adjacent to a rear part of the interface 30 and the exposing module 40-2 is disposed to be adjacent to a rear part of the substrate transferring module 40-1. The substrate transferring module 40-1 transfers a substrate between the interface 30 and the exposing module 40-2, and the exposing module 40-2 performs an exposing process that transfers a circuit pattern onto a substrate on which a coating process is performed.

The substrate transferring module 40-1 includes a loading portion 42, an unloading portion 44 and a transfer robot 46. The loading portion 42 provides a place where a substrate which is transferred from the interface 30 to the exposing module 40-2 and on which an exposing process will be performed is standing by. The unloading portion 44 provides a place where a substrate which is transferred from the exposing module 40-2 to the interface 30 and on which an exposing process is completed is standing by. The transfer robot 46 transfers a substrate from the loading portion 42 to the exposing portion 40-2. The transferring robot 46 also transfers a substrate from the exposing module 40-2 to the unloading portion 44.

An edge exposing module (not shown) or an arrangement module (not shown) may be disposed between the substrate transferring module 40-1 and the exposing module 40-2. The edge exposing module performs an edge exposing process that exposes unnecessary photoresist coated on an edge portion of a substrate. The arrangement module (not shown) performs a process that preliminarily arranges a location and a direction of a substrate on which an exposing process will be performed.

Figure 2:
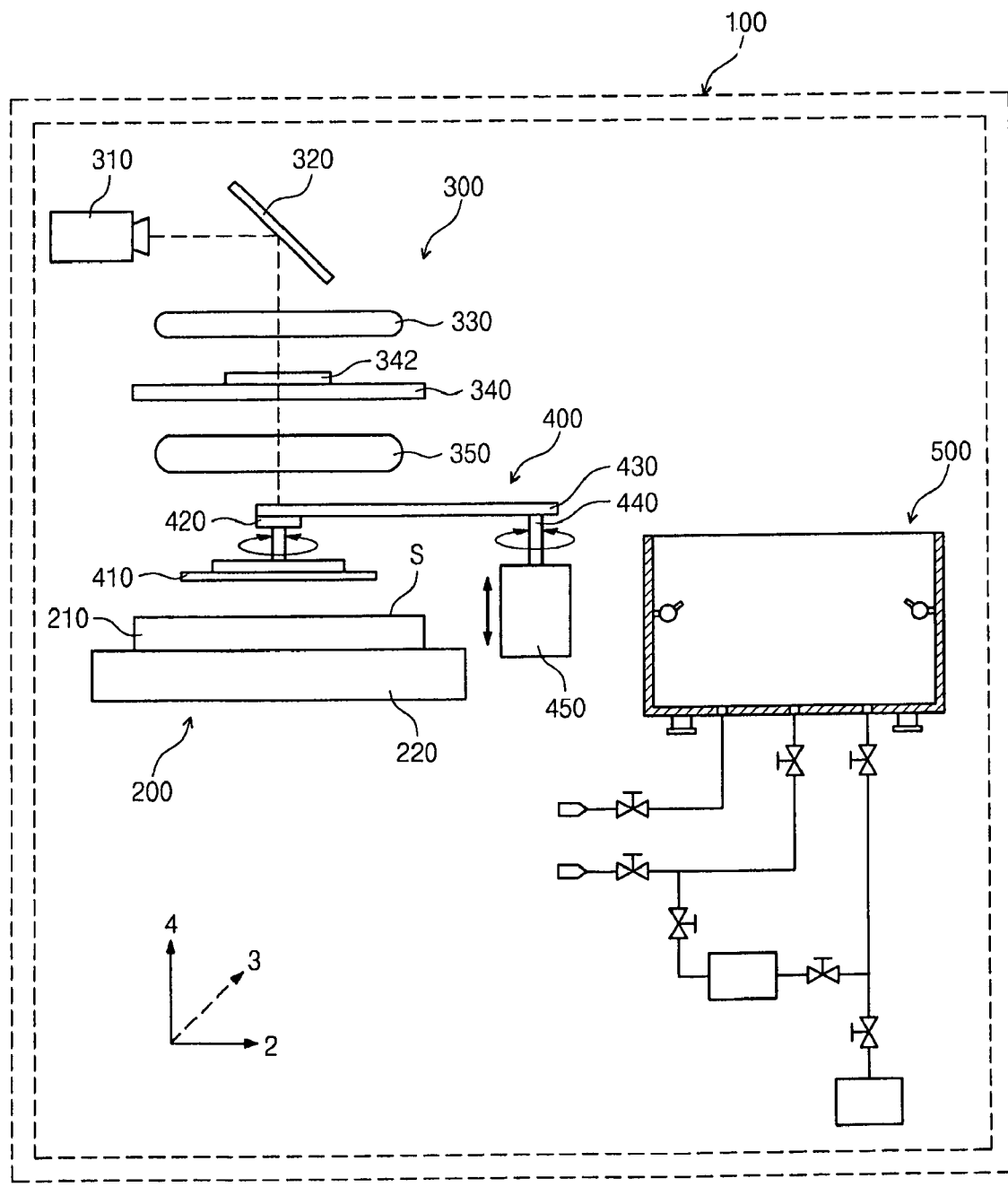
FIG. 2 is a schematic diagram illustrating an exposing module of FIG. 1.

FIG. 2 is a drawing showing an exposing module 40-2 of FIG. 1. Referring to FIG. 2, the exposing module 40-2 includes a treating room 100, a chuck member 200, an exposing member 300, a chuck cleaning member 400 and a tool cleaning member 500. The treating room 100 provides a space in which an exposing process is performed on a substrate. The chuck member 200 is installed on an inside of the treating room 100. The exposing member 300 is disposed on an upper portion of the chuck member 200 and the chuck cleaning member 400 is disposed to be adjacent to the chuck member 200. The chuck member 200 supports a substrate on which an exposing process will be performed and the exposing member 300 irradiates light including image information of a circuit pattern onto a substrate placed on the chuck member 200. The chuck cleaning member 400 removes a foreign substance from a substrate loading surface (S) of the chuck member 200. The tool cleaning member 500 is disposed adjacent to the chuck cleaning member 400. Alternatively, tool cleaning member 500 may be disposed to be spaced apart from the chuck cleaning member 400 and may be moved to a position adjacent to the chuck cleaning member 400 by a moving means (not shown). The tool cleaning member 500 cleans a cleaning tool 410 of the chuck cleaning member 400.

If a foreign substance such as a particle is on a substrate loading surface (S), a substrate at a position on which a particle is present may be partly deformed by a particle. If a substrate is deformed, a defocus phenomenon that a focus depth of a lens of a position where a particle exists is out of a standard value may occur during an exposing process. The chuck cleaning member 400 periodically removes a foreign substance on a substrate loading surface (S) of the chuck member 200 to prevent the above defocus phenomenon. However, in the case that the chuck cleaning member 400 is repeatedly used, a foreign substance may be accumulated on the cleaning tool 410 of the chuck cleaning member 400. A foreign substance accumulated on the cleaning tool 410 may contaminate a substrate loading surface (S) of the chuck member 200, thereby causing a defocus phenomenon. In the present inventive concept, the tool cleaning member 500 cleaning the cleaning tool 410 is provided to prevent a reverse contamination of the chuck member 200 by the cleaning tool 410 and a defocus phenomenon.

The chuck member 200 includes a supporting plate 210 on which a substrate is placed and a substrate stage 220 that transfers the supporting plate 210 in a horizontal direction. The supporting plate 210 may fix a substrate by a vacuum absorption method. The substrate stage 220 may include a driving member (not shown) moving the supporting plate 210 in a first direction 2 and a driving member (not shown) moving the supporting plate 210 in a second direction 3 which is perpendicular to the first direction 2 and a third direction 4.

The exposing member 300 irradiates light including image information of a circuit pattern onto a substrate placed on the chuck member 200. The exposing member 300 includes a light source 310, a reflecting mirror 320, an illumination optical system 330, a reticle stage 340, and a projection optical system 350. The light source 310 provides a light for an exposure. A mercury lamp, fluoride argon (ArF), a laser generating device, an extreme ultraviolet beam, an electron beam generating device or the like may be used as a light source 310. The reflecting mirror 320 reflects light irradiated from the light source 310, and light reflected by the reflecting mirror 320 is concentrated by the illumination optical system 330. A reticle 342 including a circuit pattern is located under the illumination optical system 330, and the reticle 342 may be moved by the reticle stage 340. The illumination optical system 330 transfers a concentrated light to the reticle 342 and a light passing through a circuit pattern of the reticle 342 is irradiated into the projection optical system 350. The projection optical system 350 projects light including image information of a circuit pattern onto a substrate placed on the supporting plate 210 of the substrate stage 220.

The chuck cleaning member 400 is disposed to be adjacent to the chuck member 200 and removes a foreign substance on a top surface (i.e., a substrate loading surface) of the supporting plate 210 of the chuck member 200. The chuck cleaning member 400 includes a cleaning tool 410 that removes a foreign substance on a substrate loading surface (S) of the supporting plate 210. A cleaning stone may be used as a cleaning tool 410. The cleaning tool 410 may have a circular shape and is disposed to be parallel to a top surface of the supporting plate 210. The cleaning tool 410 is connected to a first driving member 420 providing a rotatory power to the cleaning tool 410. The first driving member 420 is connected to one end of a horizontal supporting rod 430 disposed horizontally in the first direction 2. A vertical supporting rod 440 is connected to the other end of the horizontal supporting rod 430 and is disposed to be perpendicular to the horizontal supporting rod 430 along the third direction 4. The vertical supporting rod 440 is connected to a second driving member 450 providing a rotatory power to the vertical supporting rod 440. The second driving member 450 may provide not only a rotatory power to the vertical supporting rod 440 but also a driving power linearly moving the vertical supporting rod 440 along the third direction 4. A cleaning brush may be used as the cleaning tool 410 instead of the cleaning stone.

The tool cleaning member 500 is disposed to be adjacent to the chuck cleaning member 400 and cleans the cleaning tool 410 of the chuck cleaning member 400. As described above, cleaning the cleaning tool 410 is performed to prevent a substrate loading surface (S) of the chuck member 200 from being contaminated by a foreign substance accumulated on the cleaning tool 410.

Figure 3:
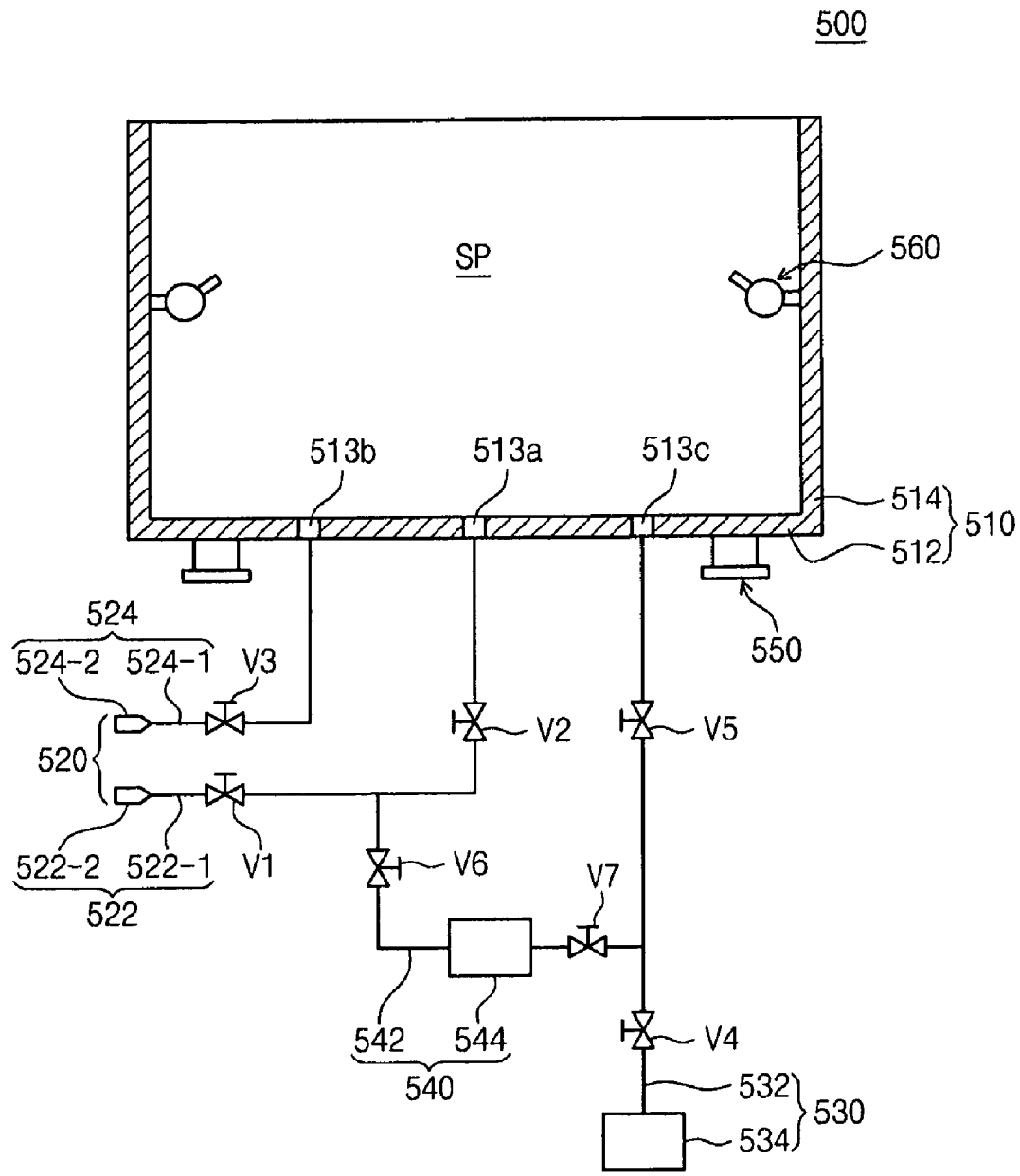
FIG. 3 is a schematic diagram illustrating a tool cleaning member of FIG. 2.

FIG. 3 is a drawing showing a tool cleaning member of FIG. 2. Referring to FIG. 3, the cleaning member 500 includes a treating bath 510, a treating solution supply unit 520, a drain unit 530 and a chemical solution circulation unit 540. The treating bath 510 includes a bottom wall 512 and a sidewall 514 upwardly extending from an edge of the bottom wall 512. A chemical solution inflowing hole 513a to which a chemical solution supply line 522-1 is connected, a rinse inflowing hole 513b to which a rinse solution supply line 524-1 is connected, and a drain hole 513c to which a drain line 532 is connected are formed on the bottom wall 512 of the treating bath 510. A cleaning tool 410 can be received in a space (SP) formed by the bottom wall 512 and the sidewall 514. The treating bath 510 may be formed of poly tetra fluoro ethylene (PTFE) material having acid-resistance and corrosion-resistance.

The treating solution supply unit 520 includes a chemical solution supply unit 522 and a rinse solution supply unit 524. The chemical solution supply unit 522 supplies a chemical solution into the treating bath 510 and the rinse solution supply unit 524 supplies a rinse solution into the treating bath 510.

The chemical solution supply unit 522 includes the chemical solution supply line 522-1 one end of which is connected to the chemical solution inflowing hole 513a of the treating bath 510. The other end of the chemical solution supply line 522-1 is connected to a chemical solution supply source 522-2, and valves (V1, V2) opening and closing a flowing of a chemical solution are installed on the chemical solution supply line 522-1. The valve (V1) is installed at a position adjacent to the chemical solution supply source 522-2 on the chemical solution supply line 522-1 and the valve (V2) is installed at a position adjacent to the chemical inflowing hole 513a on the chemical solution supply line 522-1.

The rinse solution supply unit 524 includes a rinse solution supply line 524-1 one end of which is connected to the rinse solution inflowing hole 513b of the treating bath 510. The other end of the rinse solution supply line 524-1 is connected to a rinse solution supply source 524-2, and a valve (V3) opening and closing a flowing of a rinse solution is installed on the rinse solution supply line 524-1.

The drain unit 530 discharges a chemical solution or a rinse solution supplied to the treating bath 510 from the treating bath 510. The drain unit 530 includes a drain line 532 one end of which is connected to the drain hole 513c of the treating bath 510. The other end of the drain line 532 is connected to a drain member 534 such as a pump, and valves (V4, V5) opening and closing a flowing of a chemical solution or a rinse solution are installed on the drain line 532. The valve (V4) is installed at a position adjacent to the drain member 534 on the drain line 532 and the valve (V5) is installed at a position adjacent to the drain hole 513c on the drain line 532.

The chemical solution circulation unit 540 circulates a chemical solution discharged from the treating bath 510 and resupplies a circulated chemical solution to the treating bath 510. The chemical solution circulation unit 540 includes a circulation line 542 which branches off from the drain line 532 and joins the chemical solution supply line 522-1. The circulation line 542 branches off from a position between the valves (V4, V5) on the drain line 532 and joins a position between the valves (V1, V2) on the chemical solution supply line 522-1. A pump 544 is installed on the circulation line 542 and valves (V6, V7) are installed at a front part and a rear part of the pump 544 on the circulation line 542, respectively.

An ultrasonic vibration unit 550 applying an ultrasonic vibration to a treating solution (a chemical solution, a rinse solution) supplied to the treating bath 510 may be installed at the bottom wall 512 of the treating bath 510. The ultrasonic vibration unit 550 may be installed on the sidewall 514 of the treating bath 510. A piezoelectric material changing an electric energy to a mechanical vibration energy may be used as the ultrasonic vibration unit 550. When the cleaning tool 410 is cleaned, the ultrasonic vibration unit 550 transfers a strong vibration caused by a sound wave to a treating solution (a chemical solution, a rinse solution). A cavitation bubble is exploded by a vibration applied to the treating solution and the explosion makes a gap between foreign substances attached the cleaning tool 410. Bubbles penetrate into the gap and are exploded to remove foreign substances from a surface of the cleaning tool 410.

A drying gas supply unit 560 spraying a drying gas on the cleaning tool 410 may be installed on the sidewall 514 of the treating unit 510. The drying gas supply unit 560 may be installed on the bottom wall 512 of the treating bath 510. A heated air or an inert gas such as a heated nitrogen gas may be used as the drying gas. When the cleaning tool 410 is cleaned, the drying gas supply unit 560 supplies a drying gas to the cleaning tool 410 and dries a rinse solution remaining in the cleaning tool 410.

In the exposing module (40-2 of FIG. 2) having the above constitution, as an exposing process is repeatedly performed on a substrate, foreign substances are accumulated on a top surface of the supporting plate 210 of the chuck member 200. Foreign substances on the top surface of the supporting plate 210 are repeatedly removed by the cleaning tool 410 of the chuck cleaning member 400. Foreign substances may be accumulated in the cleaning tool 410 and the foreign substances in the cleaning tool 410 are removed by the tool cleaning member 500.

A process of cleaning the cleaning tool 410 using the tool cleaning member 500 is as follows. FIGS. 4 through 10 are drawings showing a process of cleaning the cleaning tool.

Figure 4:
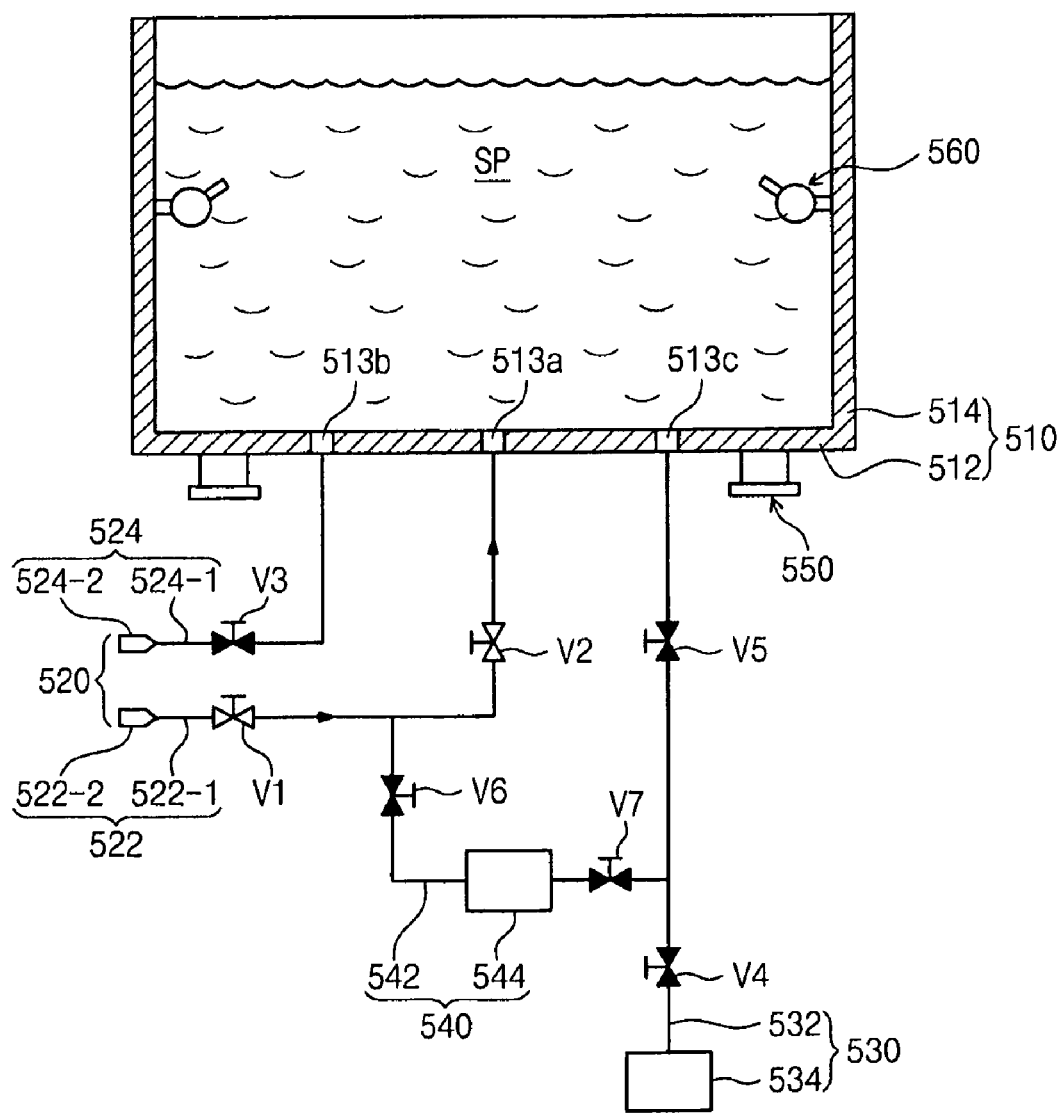
FIGS. 4 through 10 are schematic diagrams illustrating a process of cleaning a cleaning tool according to an embodiment of the inventive concept.

First, the valves (V1, V2) installed on the chemical solution supply line 522-1 are opened and a chemical solution is supplied from the chemical supply source 522-2 to the treating bath 510. A chemical solution continues to be supplied to the treating bath 510 until the chemical solution reaches a predetermined height in the treating bath 510. At this time, the valve (V3) installed on the rinse solution supply line 524-1, the valves (V4, V5) installed on the drain line 532 and the valves (V6, V7) installed on the circulation line 542 are closed. (FIG. 4)

Figure 5:
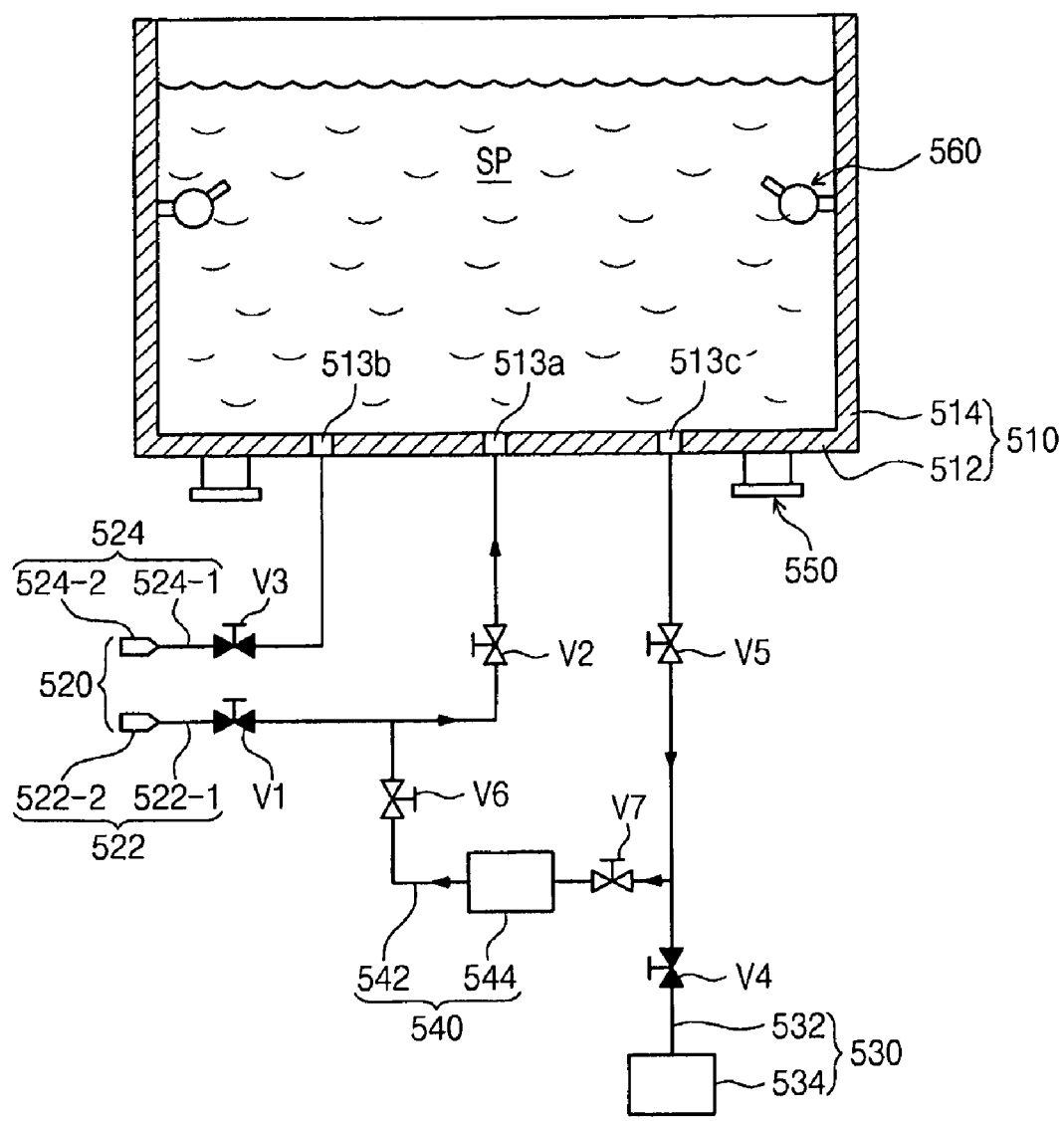

After a chemical solution reaches the predetermined height in the treating bath 510, the supply of a chemical solution from the chemical solution source 522-2 to the treating bath 510 stops. At this time, the valve (V1) is closed and the valves (V5, V6, V7) are opened. The chemical solution supplied to the treating bath 510 is discharged to the drain line 532 through the drain hole 513c and is resupplied to the treating bath 510 through the chemical inflowing hole 513a by way of the circulation line 542 and the chemical solution supply line 522-1. (FIG. 5)

Figure 6A:
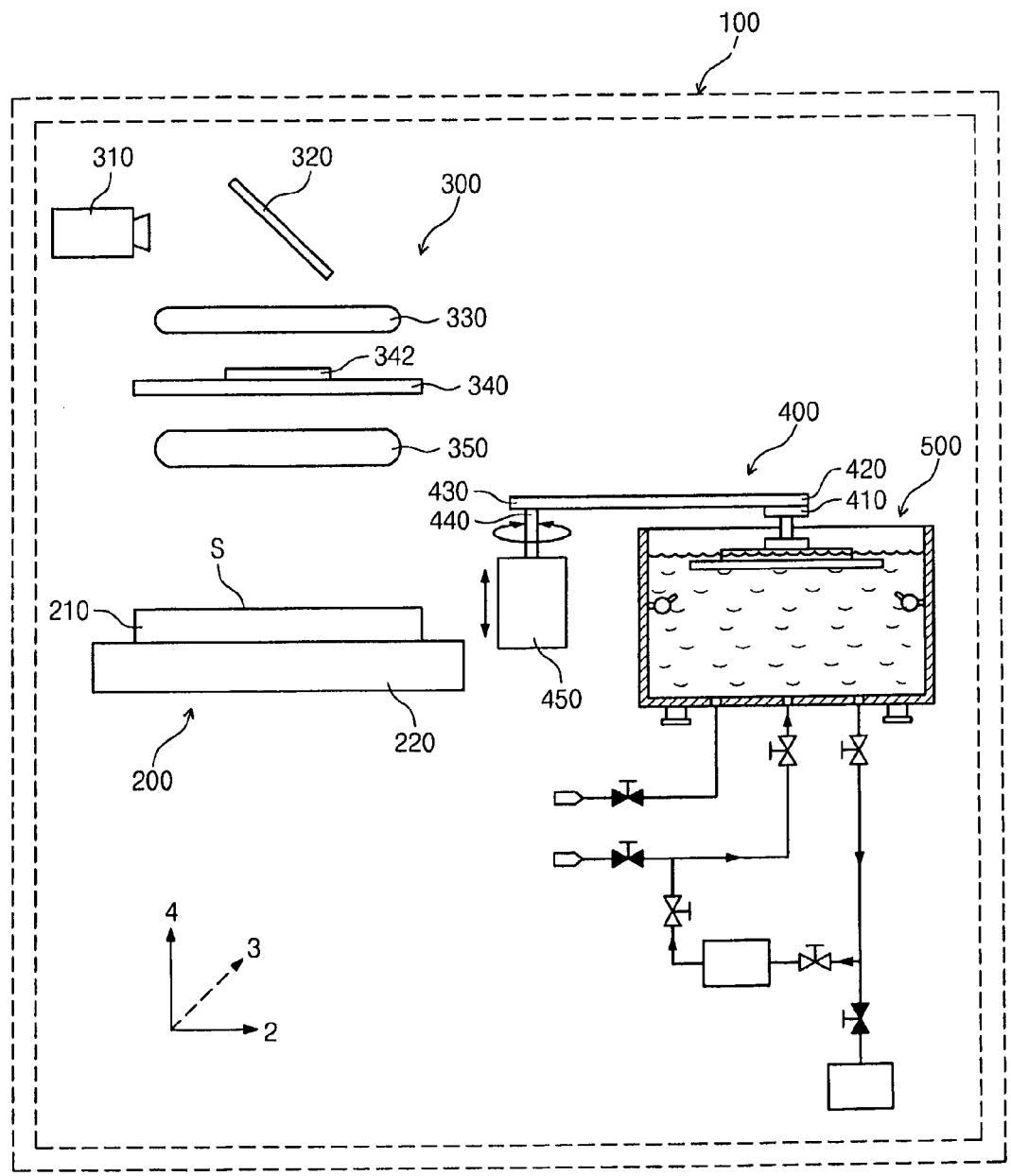

The second driving member 450 rotates the vertical supporting rod 440 and moves the vertical supporting rod 440 up and down along the third direction 4. The horizontal supporting rod 430 and the cleaning tool 410 are rotated by rotation of the vertical supporting rod 440 and moved up and down along the third direction 4 by an up and down movement of the vertical supporting rod 430. The cleaning tool 410 is submerged in a chemical solution in the treating bath 510 by this operation. (FIG. 6a)

Figure 6B:
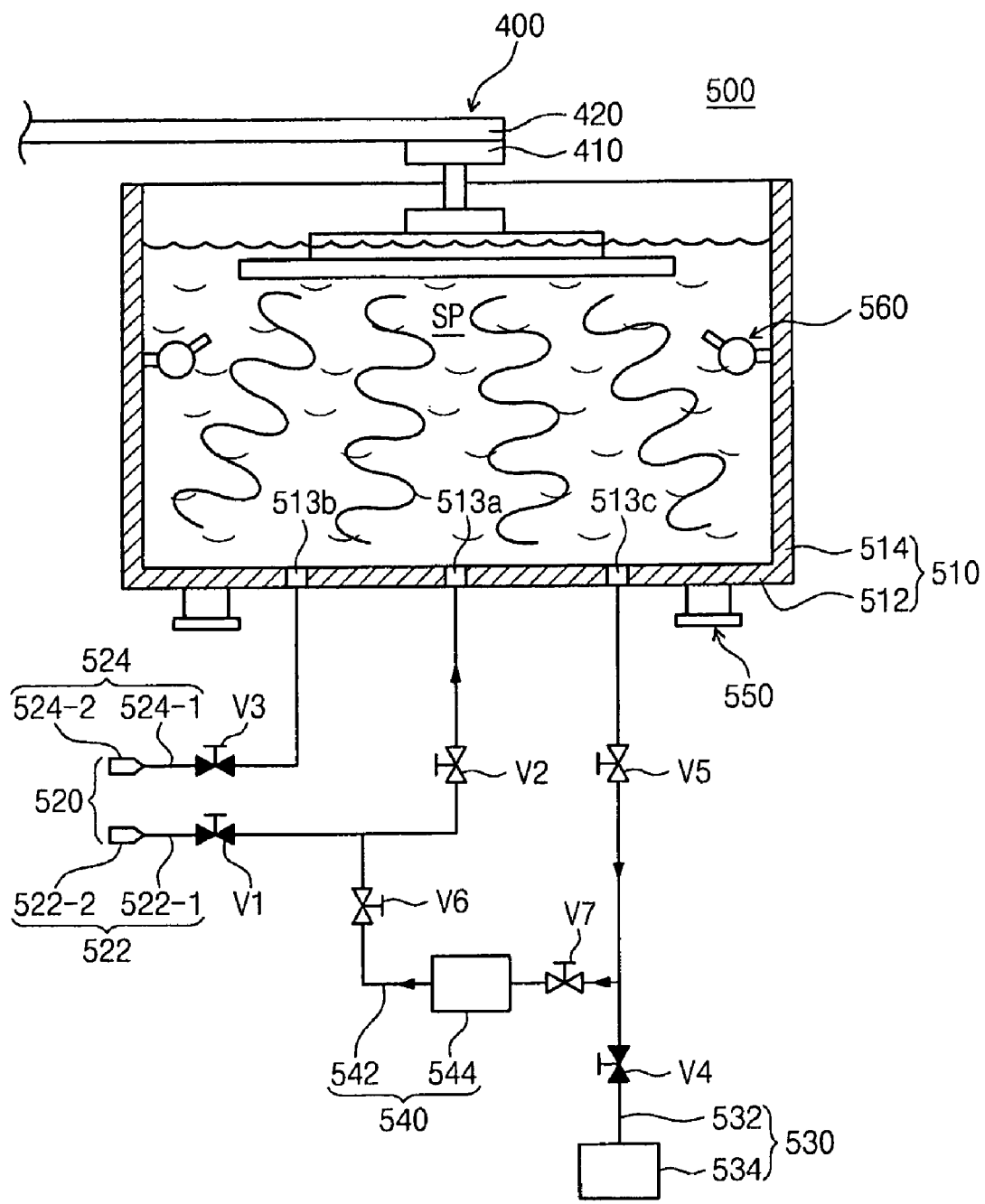

If the cleaning tool 410 is submerged in the chemical solution in the treating bath 510, foreign substances accumulated in the cleaning tool 410 are removed by the chemical solution. At this time, the ultrasonic vibration unit 550 applies an ultrasonic vibration to a chemical solution. The ultrasonic vibration applied to a chemical solution facilitates a chemical reaction between foreign substances accumulated in the cleaning tool 410 and the chemical solution to improve a removal efficiency of a foreign substance. (FIG. 6b)

Figure 7:
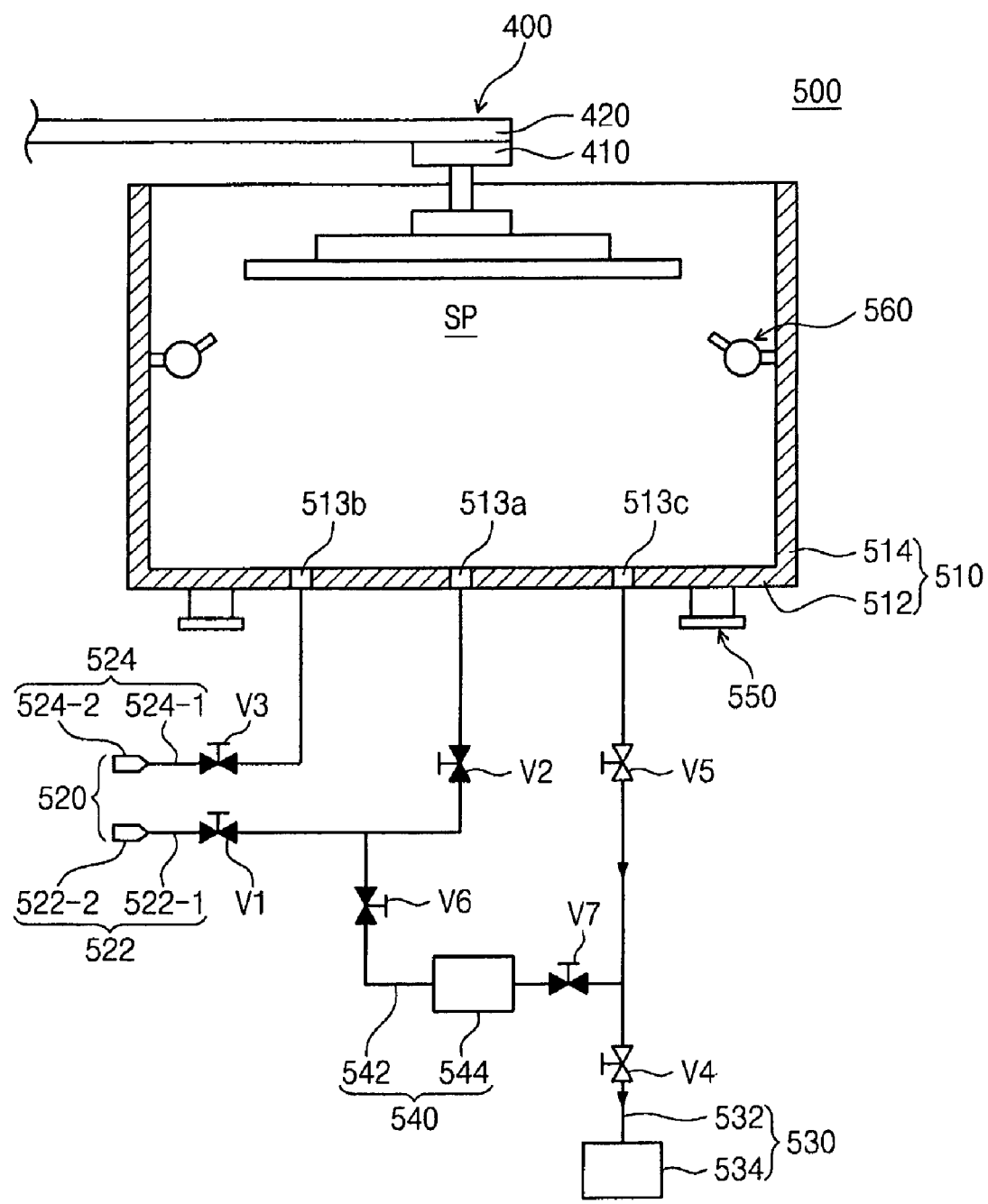

When a chemical treatment of the cleaning tool 410 is completed, the valves (V2, V6, V7) are closed and the valve (V4) is opened. A chemical solution in the treating bath 510 is discharged to the drain line 532 through the drain hole 513c. (FIG. 7)

Figure 8:
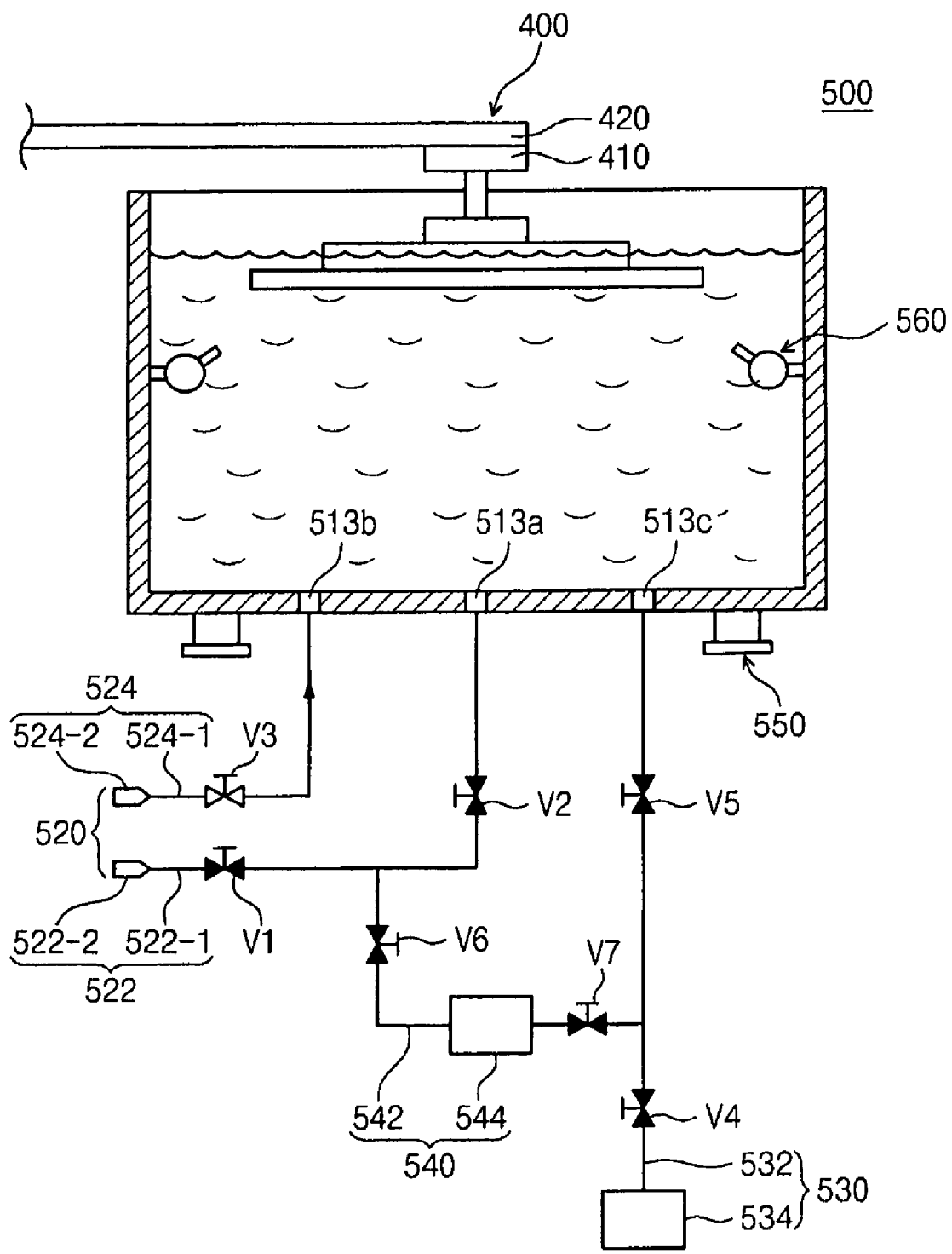

After a chemical solution in the treating bath 510 is discharged, the valves (V4, V5) are closed. The valve (V3) installed on the rinse solution supply line 524-1 is opened and a rinse solution is supplied from the rinse solution source 524-2 to the treating bath 510. A rinse solution continues to be supplied until the rinse solution reaches a predetermined height (i.e., a height that the cleaning tool 410 is submerged in the rinse solution) in the treating bath 510. After a rinse solution reaches the predetermined height in the treating bath 510, the supply of a rinse solution from the rinse solution source 524-2 to the treating bath 510 stops and the valve (V3) is closed. Then, a rinse solution rinses the cleaning tool 410. Although it is not shown in drawings, the ultrasonic vibration unit 550 may apply an ultrasonic vibration to a rinse solution. (FIG. 8)

Figure 9:
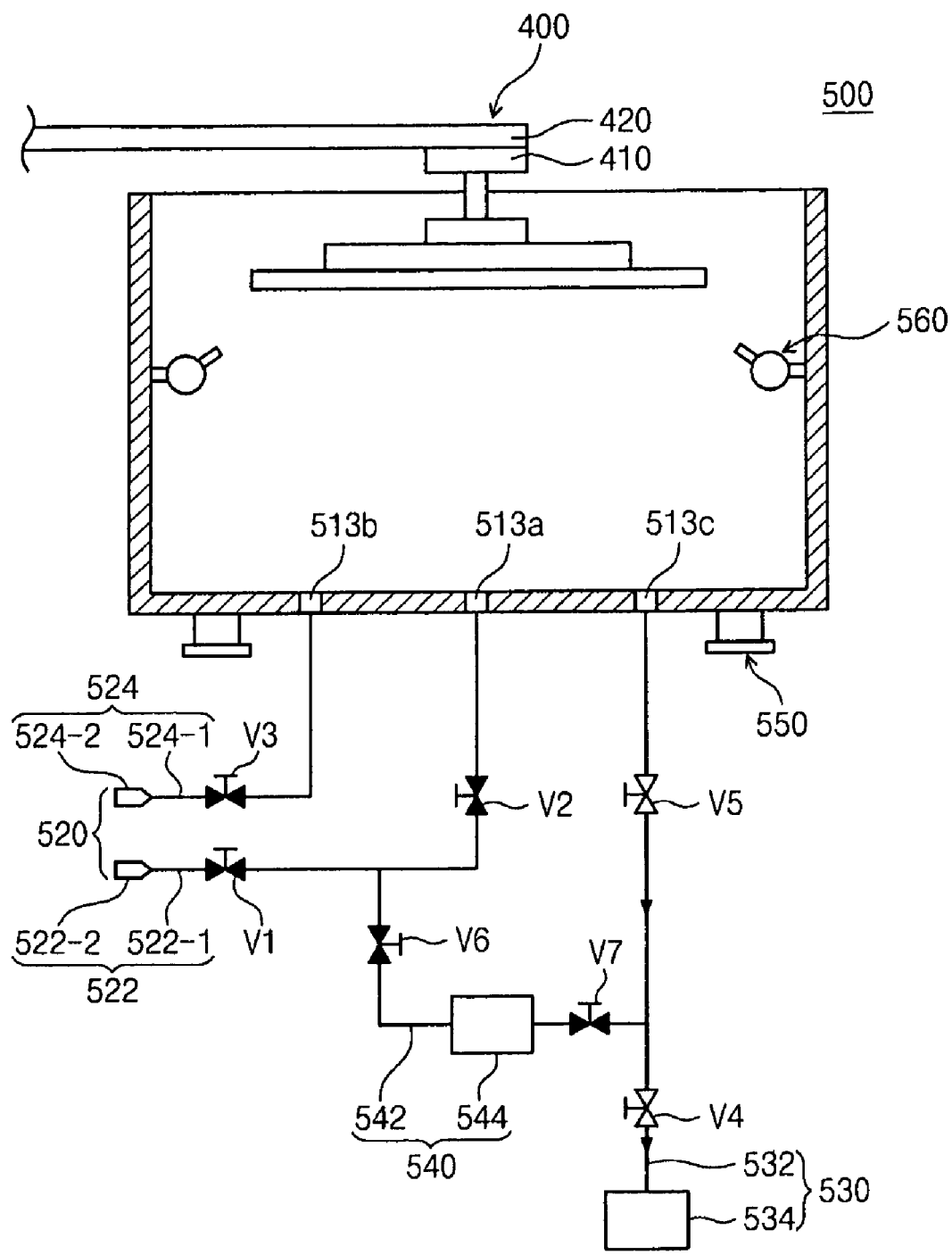

When a rinse treatment of the cleaning tool 410 is completed, the valve (V3) is closed and the valves (V4, V5) are opened. A rinse solution in the treating bath 510 is discharged to the drain line 532 through the drain hole 513c. (FIG. 9)

Figure 10:
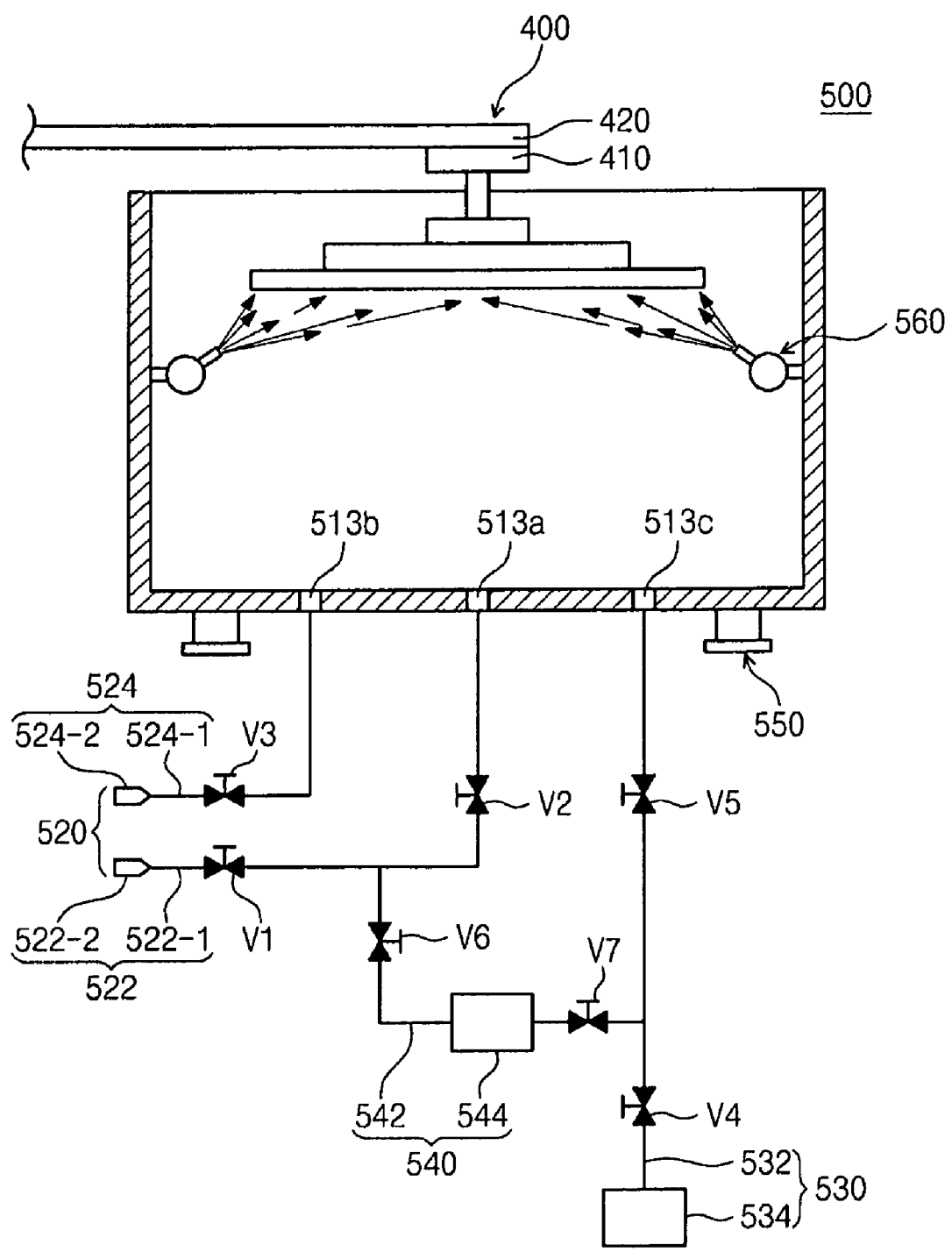

After a rinse solution in the treating bath 510 is discharged, the valves (V4, V5) are closed and a drying gas is supplied to the cleaning tool 410 from the drying gas supply unit 560. A rinse solution remaining in the cleaning tool 410 is dried by a drying gas. (FIG. 10)

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A substrate treating apparatus, comprising:
a treating room providing a space where a substrate treating process is performed;
a chuck member which is installed on an inside of the treating room and on which a substrate is placed;
a chuck cleaning member which is installed to be adjacent to the chuck member and includes a cleaning tool removing a foreign substance on a substrate loading surface of the chuck member, wherein the chuck cleaning member comprises:
 a first driving member providing a rotatory power to the cleaning tool;
 a horizontal supporting rod disposed horizontally and having one end, the first driving member being installed at the one end of the horizontal supporting rod;
 a vertical supporting rod which is connected to the other end of the horizontal supporting rod and disposed to be perpendicular to the horizontal supporting rod; and
 a second driving member providing a rotatory power to the vertical supporting rod; and
a tool cleaning member cleaning the cleaning tool, wherein the tool cleaning member comprises:
 a treating bath with an opened top which provides a space in which the cleaning tool is received;
 a treating solution supply unit supplying a treating solution to the treating bath; and
 a drain unit including a drain line connected to a drain hole formed on a wall of the treating bath.

2. The substrate treating apparatus of claim 1, wherein the treating solution supply unit comprises:
- a chemical solution supply unit including a chemical solution supply line connected to a chemical solution inflowing hole formed on the wall of the treating bath; and
- a rinse solution supply unit including a rinse solution supply line connected to a rinse solution inflowing hole formed on the wall of the treating bath.

3. The substrate treating apparatus of claim 2, further comprising a chemical solution circulation unit which circulates a chemical solution discharged from the treating bath and resupplies a circulated chemical solution to the treating bath,
wherein the chemical solution circulation unit comprises:
- a circulation line which branches off from the drain line and joins the chemical solution supply line; and
- a pump installed on the circulation line.

4. The substrate treating apparatus of claim 1, wherein the tool cleaning member further comprises an ultrasonic vibration unit which is installed on the wall of the treating bath and applies an ultrasonic vibration to the treating solution supplied into the treating bath.

5. The substrate treating apparatus of claim 1, wherein the tool cleaning member further comprises a drying gas supply unit supplying a drying gas to the cleaning tool received in the treating bath.

6. The substrate treating apparatus of claim 1, wherein the cleaning tool comprises a cleaning stone.

7. The substrate treating apparatus of claim 1, wherein the tool cleaning member is disposed to be adjacent to the chuck cleaning member inside the treating room.

8. An exposing apparatus, comprising:
- a treating room providing a space where a substrate treating process is performed;
- a chuck member which is installed on an inside of the treating room and on which a substrate is placed;
- an exposing member irradiating light including an image of a circuit pattern onto a substrate placed on the chuck member;
- a chuck cleaning member which is disposed to be adjacent to the chuck member and includes a cleaning tool removing a foreign substance on a substrate loading surface of the chuck member, wherein the chuck cleaning member comprises:
  - a first driving member providing a rotatory power to the cleaning tool;
  - a horizontal supporting rod disposed horizontally and having one end, the first driving member being installed at the one end of the horizontal supporting rod;
  - a vertical supporting rod which is connected to the other end of the horizontal supporting rod and disposed to be perpendicular to the horizontal supporting rod; and
  - a second driving member providing a rotatory power to the vertical supporting rod; and
- a tool cleaning member cleaning the cleaning tool, wherein the tool cleaning member comprises:
  - a treating bath with an opened top providing a space in which the cleaning tool is received;
  - a chemical solution supply unit including a chemical solution supply line connected to a chemical solution inflowing hole formed on a wall of the treating bath;
  - a rinse solution supply unit including a rinse solution supply line connected to a rinse solution inflowing hole formed on the wall of the treating bath; and
  - a drain unit including a drain line connected to a drain hole formed on the wall of the treating bath.

9. The exposing apparatus of claim 8, further comprising a chemical solution circulation unit which circulates a chemical solution discharged from the treating bath and resupplies a circulated chemical solution to the treating bath,
wherein the chemical circulation unit comprises:
- a circulation line which branches off from the drain line and joins the chemical solution supply line; and
- a pump installed on the circulation line.

10. The exposing apparatus of claim 8, wherein the tool cleaning member further comprises an ultrasonic vibration unit which is installed on the wall of the treating bath and applies an ultrasonic vibration to a treating solution supplied into the treating bath.

11. The exposing apparatus of claim 8, wherein the tool cleaning member further comprises a drying gas supply unit supplying a drying gas to the cleaning tool in the treating bath.

12. The exposing apparatus of claim 8, wherein the cleaning tool comprises a cleaning stone.

13. The exposing apparatus of claim 8, wherein the tool cleaning member is disposed to be adjacent to the chuck cleaning member inside the treating room.

* * * * *